US006911702B2

(12) United States Patent
Abbott

(10) Patent No.: US 6,911,702 B2
(45) Date of Patent: Jun. 28, 2005

(54) INTEGRATED CIRCUITRY

(75) Inventor: Todd R. Abbott, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 10/305,604

(22) Filed: Nov. 26, 2002

(65) Prior Publication Data
US 2003/0082868 A1 May 1, 2003

Related U.S. Application Data

(62) Division of application No. 10/001,758, filed on Oct. 24, 2001, now Pat. No. 6,727,168.

(51) Int. Cl.[7] .......................... H01L 29/76; H01L 29/94
(52) U.S. Cl. ........................ 257/369; 257/393; 257/412
(58) Field of Search ................................ 257/393, 903, 257/412, 413, 384, 369; 438/618, 622, 624, 629, 630, 649, 586, 592, 637

(56) References Cited

U.S. PATENT DOCUMENTS

| | | | | |
|---|---|---|---|---|
| 4,873,204 A | * | 10/1989 | Wong et al. ................ | 438/649 |
| 4,996,167 A | | 2/1991 | Chen .......................... | 438/618 |
| 5,294,822 A | * | 3/1994 | Verrett ....................... | 257/368 |
| RE35,827 E | * | 6/1998 | Gualandris et al. ......... | 257/285 |
| 5,883,418 A | * | 3/1999 | Kimura ...................... | 257/412 |
| 5,888,903 A | | 3/1999 | O'Brien et al. | |
| 5,915,199 A | * | 6/1999 | Hsu ........................... | 438/618 |
| 5,920,098 A | | 7/1999 | Liaw .......................... | 257/383 |
| 5,990,524 A | | 11/1999 | En et al. .................... | 257/382 |
| 6,022,799 A | | 2/2000 | Foote et al. | |
| 6,037,232 A | | 3/2000 | Wieczorek et al. | |
| 6,060,387 A | * | 5/2000 | Shepela et al. ............. | 438/630 |
| 6,066,555 A | | 5/2000 | Nulty et al. | |
| 6,080,648 A | | 6/2000 | Nagashima | |
| 6,100,185 A | | 8/2000 | Hu .............................. | 438/642 |
| 6,124,217 A | | 9/2000 | Sun et al. | |
| 6,180,494 B1 | | 1/2001 | Manning .................... | 438/443 |
| 6,184,073 B1 | | 2/2001 | Lage et al. | |
| 6,201,303 B1 | | 3/2001 | Ngo et al. .................. | 257/768 |
| 6,207,514 B1 | | 3/2001 | Furukawa et al. | |
| 6,211,054 B1 | | 4/2001 | Li et al. ..................... | 438/618 |
| 6,271,087 B1 | | 8/2001 | Kinoshita et al. | |
| 6,329,720 B1 | | 12/2001 | Li et al. ..................... | 257/776 |
| 6,333,254 B1 | | 12/2001 | Abbott et al. | |
| 6,350,665 B1 | | 2/2002 | Jin et al. | |
| 6,376,358 B1 | | 4/2002 | Fischer et al. | |
| 6,380,596 B1 | | 4/2002 | Abbott et al. | |
| 6,413,807 B1 | * | 7/2002 | Mikagi ....................... | 438/198 |
| 6,482,699 B1 | | 11/2002 | Hu et al. | |
| 6,531,724 B1 | | 3/2003 | Furukawa et al. | |
| 6,534,805 B1 | | 3/2003 | Jin | |
| 6,535,413 B1 | | 3/2003 | Abbott et al. | |
| 6,583,518 B2 | | 6/2003 | Trivedi et al. | |
| 6,594,172 B2 | | 7/2003 | Abbott et al. | |
| 6,599,789 B1 | | 7/2003 | Abbott et al. | |
| 6,613,617 B2 | | 9/2003 | Trivedi et al. | |
| 6,686,633 B1 | | 2/2004 | Lage et al. | |
| 6,730,553 B2 | | 5/2004 | Cho et al. | |
| 6,770,921 B2 | | 8/2004 | Trivedi et al. | |
| 6,784,552 B2 | | 8/2004 | Nulty et al. | |

* cited by examiner

*Primary Examiner*—Ngân V. Ngô
*Assistant Examiner*—Theresa T. Doan
(74) *Attorney, Agent, or Firm*—Wells St. John P.S.

(57) ABSTRACT

A first dielectric layer is formed over a first transistor gate and a second transistor source/drain region. Contact openings are formed in the first dielectric layer to the first transistor gate and to the second transistor source/drain region. A second dielectric layer is formed over the first dielectric layer and to within the contact openings. The second dielectric layer is etched selectively relative to the first dielectric layer to form at least a portion of a local interconnect outline within the second dielectric layer to extend between the first transistor gate and the second transistor source/drain region. The etching removes at least some of the second dielectric layer within the contact openings. Conductive material is formed within the local interconnect outline within the second dielectric layer which electrically connects the first transistor gate with the second transistor source/drain region. Other aspects are disclosed.

13 Claims, 11 Drawing Sheets

INTEGRATED CIRCUITRY

CROSS REFERENCE TO RELATED APPLICATION

This application is a divisional of U.S. patent application Ser. No. 10/001,758, which was filed on Oct. 24, 2001 U.S. Pat. No. 6,727,168 and which is incorporated by reference herein.

TECHNICAL FIELD

This invention relates to methods of forming local interconnects, and to integrated circuitry which includes local interconnects.

BACKGROUND OF THE INVENTION

The reduction in memory cell and other circuit size in high density dynamic random access memories (DRAMs) and other circuitry is a continuing goal in semiconductor fabrication. Implementing electric circuits involves connecting isolated devices through specific electric paths. When fabricating silicon and other semiconductive materials into integrated circuits, conductive devices built into semiconductive substrates typically need to be isolated from one another. Such isolation typically occurs in the form of either trench and refill field isolation regions or LOCOS grown field oxide.

Conductive lines, for example transistor gate lines, are formed over bulk semiconductor substrates. Some lines run globally over large areas of the semiconductor substrate. Others are much shorter and associated with very small portions of the integrated circuitry, and are typically referred to as local interconnects. This invention was principally motivated in making processing improvements in the fabrication of local interconnects, and particularly in the fabrication of SRAM circuitry local interconnects and embedded technologies, although the invention is not so limited.

SUMMARY

The invention includes integrated circuitry employing local interconnects, and methods of forming local interconnects. In one implementation, a first dielectric layer is formed over a first transistor gate and a second transistor source/drain region. Contact openings are formed in the first dielectric layer to the first transistor gate and to the second transistor source/drain region. A second dielectric layer is formed over the first dielectric layer and to within the contact openings. The second dielectric layer is etched selectively relative to the first dielectric layer to form at least a portion of a local interconnect outline within the second dielectric layer to extend between the first transistor gate and the second transistor source/drain region. The etching removes at least some of the second dielectric layer within the contact openings. Conductive material is formed within the local interconnect outline within the second dielectric layer which electrically connects the first transistor gate with the second transistor source/drain region.

In one implementation, a conductive silicide is formed on the first transistor gate and on the second transistor source/drain region in at least one common step. A dielectric layer is formed over the first transistor gate silicide and the second transistor source/drain region silicide. The dielectric layer is etched to form at least a portion of a local interconnect outline therewithin to extend between the first transistor gate suicide and the second transistor source/drain region silicide. Conductive material is formed within the local interconnect outline within the dielectric layer and on the first transistor gate silicide and on the second transistor source/drain region silicide to electrically connect the first transistor gate with the second transistor source/drain region.

In one implementation, integrated circuitry includes a substrate comprising first and second transistor gates. A source/drain region is received proximate the second transistor gate. The first transistor gate includes conductively doped semiconductive material and a conductive silicide received elevationally outward thereof and in electrical connection therewith. The semiconductive material and the silicide have respective elevationally outermost surfaces. The first transistor gate has opposing sidewalls which include the semiconductive material and the silicide. A pair of insulative sidewall spacers is received over the first transistor gate sidewalls. The sidewall spacers have respective uppermost surfaces which are substantially elevationally coincident with the uppermost surface of the semiconductive material. A conductive local interconnect electrically connects the first transistor gate silicide with the source/drain region proximate the second transistor gate.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention is shown and described with reference to but one preferred embodiment in the fabrication of integrated circuitry comprising an SRAM cell having a local interconnect. Of course, the invention is not so limited.

Figure 1:
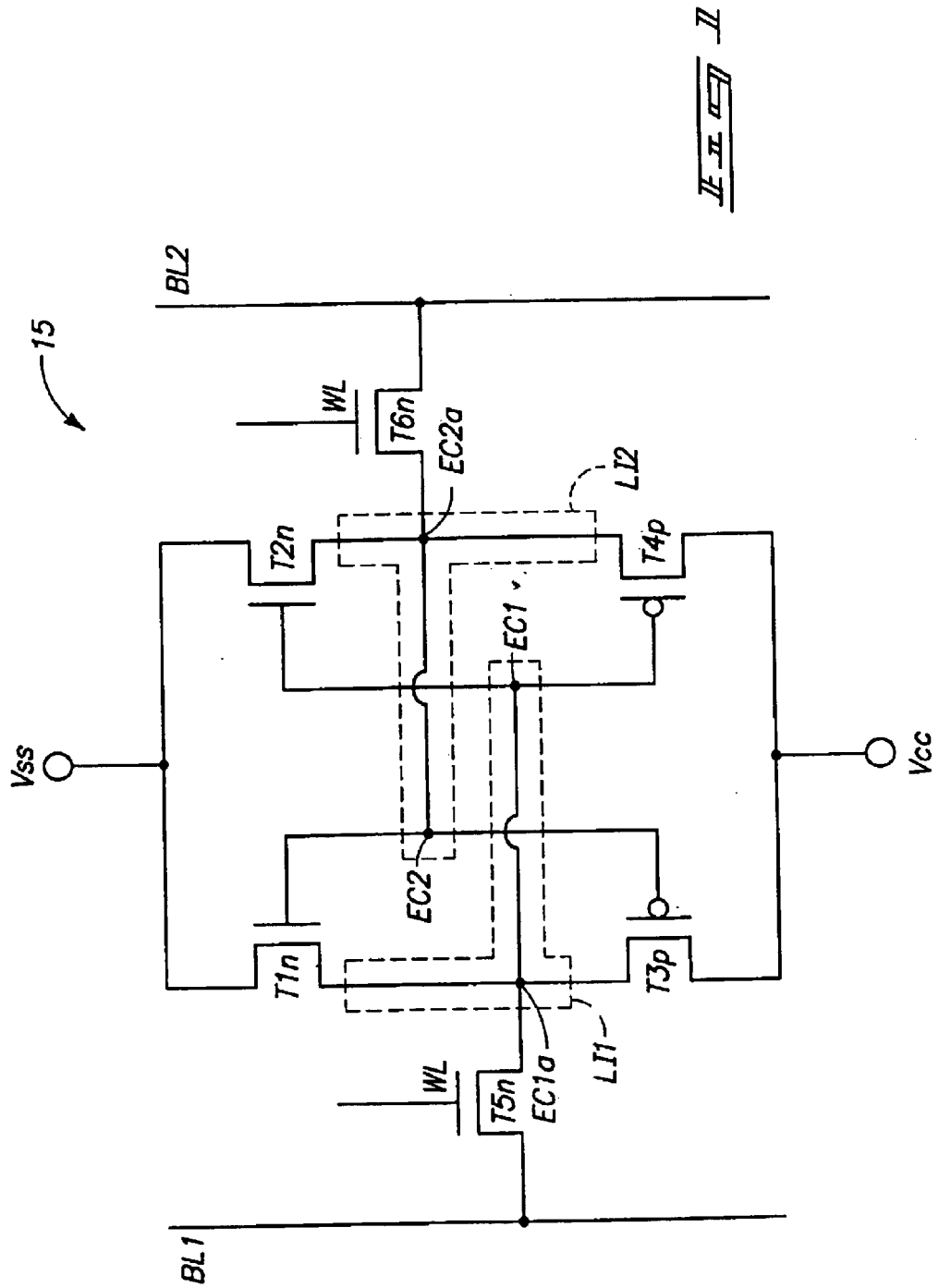
FIG. 1 is a schematic view of an SRAM cell in accordance with an aspect of the invention.
Figure 2:
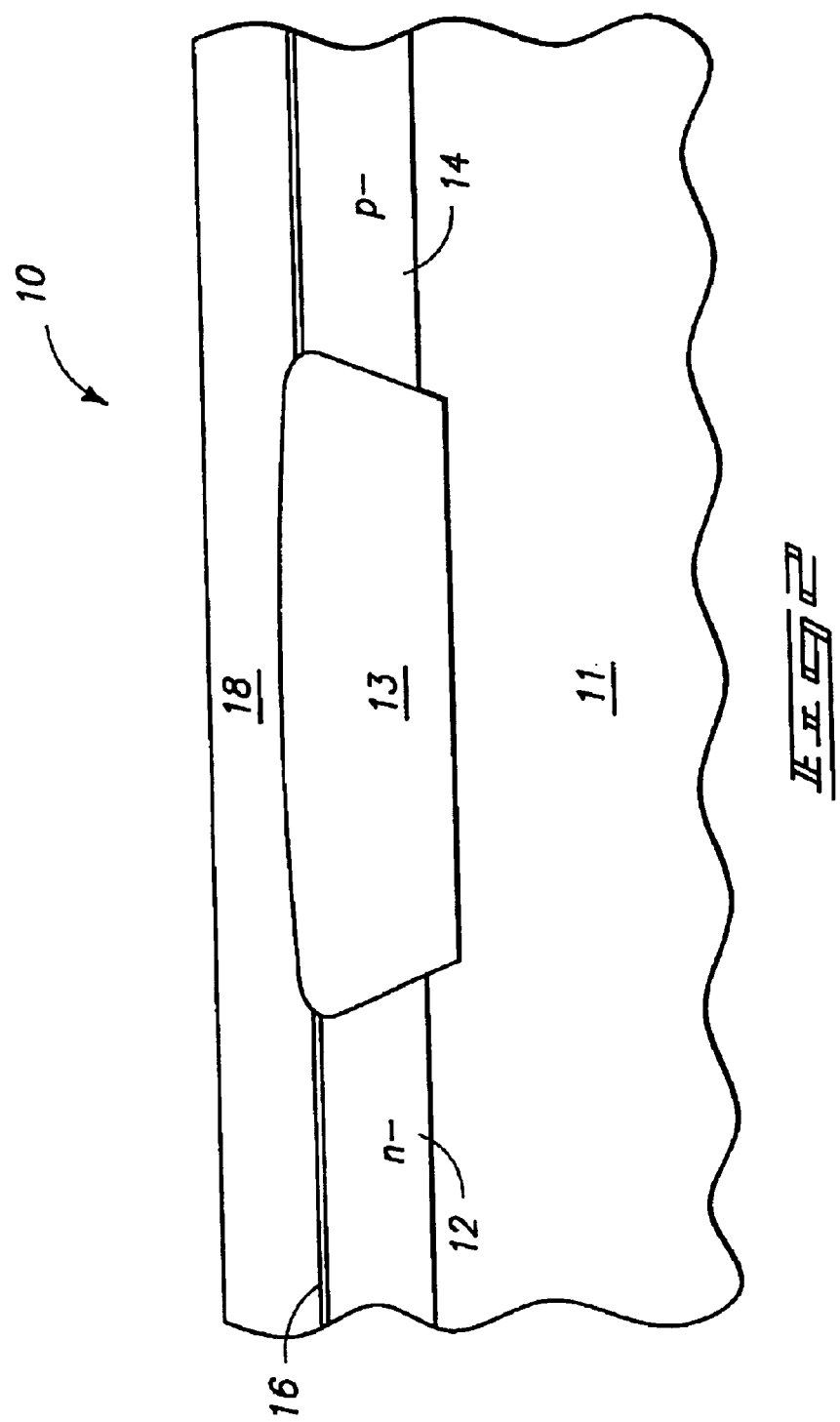
FIG. 2 is a diagrammatic sectional view of a semiconductor wafer fragment in process in accordance with an aspect of the invention, and in process for formation of the integrated circuitry of FIG. 1.

Referring to FIGS. 1 and 2, a semiconductor wafer fragment in process is indicated generally with reference numeral 10 and includes a bulk monocrystalline silicon substrate 11. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the terms "layer" and "material" encompass both the singular and the plural. Substrate 10 comprises an n-well region 12 and a p-well region 14, and a shallow trench oxide isolation region 13 therebetween (FIG. 2).

In accordance with one embodiment of the present invention, integrated circuitry comprises a static read-write memory cell 15 (FIG. 1) such as is typically used in high-density SRAMs and embedded DRAM/SRAM memories. A static memory cell is characterized by operation in one of two mutually-exclusive and self-maintaining operating states. Each operating state defines one of the two possible binary bit values, 0 or 1. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of 0, while a high or set output voltage represents a binary value of 1. U.S. Pat. No. 6,100,185, listing Jeff Yongjun Hu as the inventor, which issued on Aug. 8, 2000, describes exemplary SRAM circuitry operation and design, and is hereby incorporated by reference. Exemplary SRAM integrated circuitry 15 includes complimentary circuit components and nodes to Vcc, Vss, BL1, BL2, WL, T1n, T2n, T3p, T4p, T5n, T6n, LI1, LI2, EC1, EC1a, EC2 and EC2a.

A gate dielectric layer 16 and semiconductor material 18 are formed over substrate 11. An exemplary material for layer 16 is undoped silicon dioxide, and an exemplary material for layer 18 is polysilicon. In one preferred embodiment, semiconductive material 18 has not been conductively doped at this point in the process.

Figure 3:
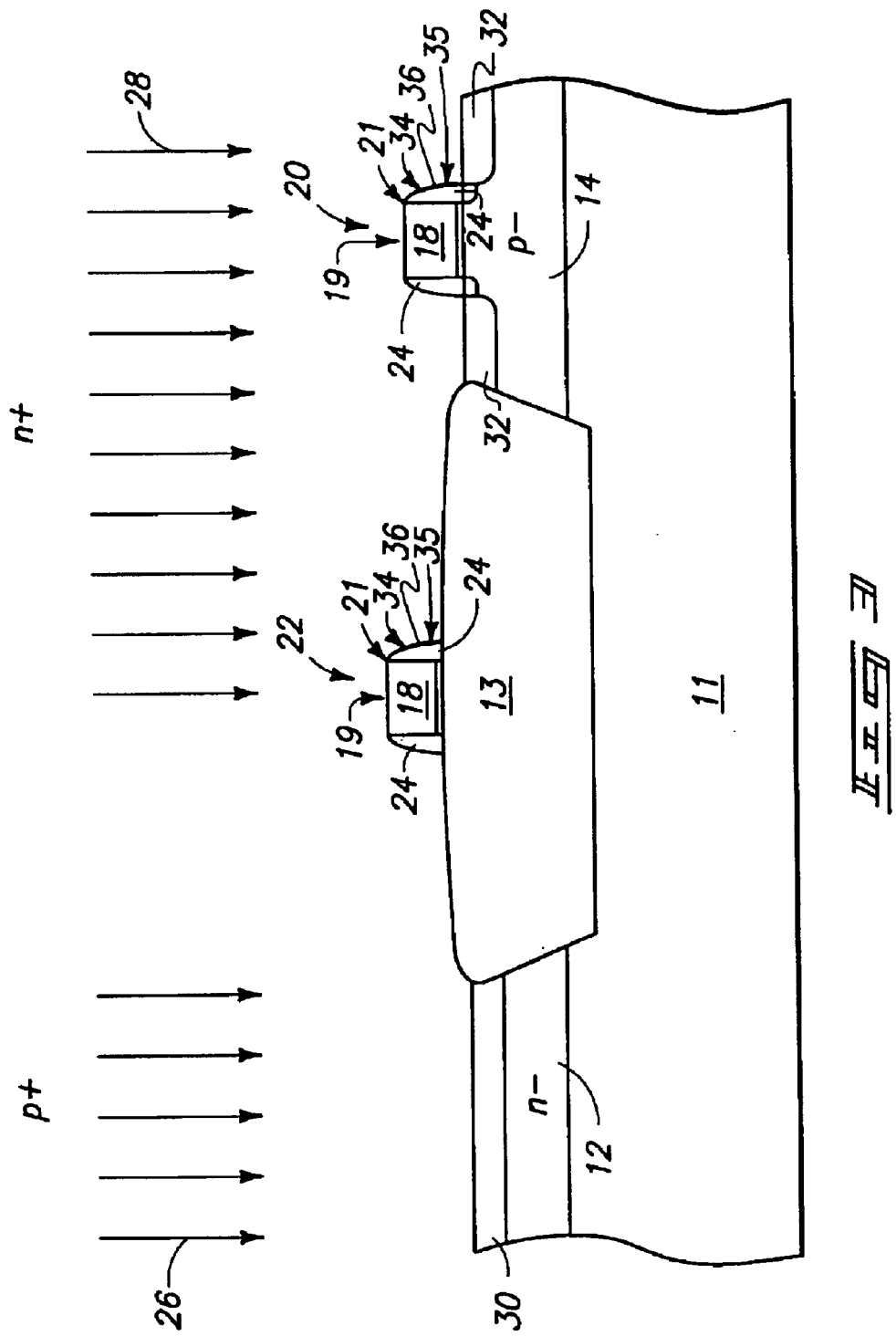
FIG. 3 is a view of the FIG. 2 wafer fragment at a processing step subsequent to that shown by FIG. 2.

Referring to FIG. 3, semiconductive material 18 is patterned to form respective gate, lines 20 and 22. Such preferably occurs by lithography, for example photolithography, ion beam lithography or any other existing or yet-to-be-developed method of patterning. Further in the preferred and illustrated embodiment, insulative anisotropically etched sidewall spacers 24 are formed over the opposing sidewalls of the transistor gate lines. Exemplary preferred materials for spacers 24 include undoped silicon dioxide and silicon nitride. Semiconductive material 18 and spacers 24 can be considered as having respective uppermost surfaces 19 and 21. The respective uppermost surfaces 19 and 21 are substantially elevationally coincident with respect to the substrate material which they overlie. In the context of this document, "substantially elevationally coincident" includes elevational heights above common substrate material which are within 50 Angstroms of one another. In one preferred implementation, respective LDD regions of desired conductivity type can be formed within substrate regions 12/14 prior to the formation of spacers 24. In one preferred implementation, respective different conductivity type implants are conducted to, in one embodiment and as indicated by arrows 26 and 28, conductively dope semiconductive material 18 after the patterning, and in one embodiment, simultaneously form respective source/drain regions 30 and 32. In the context of this document, transistor gate line 20 can be considered as a first transistor gate line of a first transistor, and region 30 considered as a source/drain region 30 of a second transistor, for example T4p, as will be inherent from the continuing discussion. That portion of the gate line for transistor T4p is not viewable in the illustrated cross-section, but is received operably adjacent source/drain region 30 in the subject preferred embodiment.

Further, for purposes of the continuing discussion, insulative sidewall spacers 24 can be considered as comprising a top region 34 and a base region 35. In the depicted preferred embodiment, base region 35 is laterally wider than top region 34. Further, the sidewall spacers have respective laterally outermost surfaces 36 which curve laterally inward from base region 35 to uppermost surface 21 of top region 34.

Figure 4:
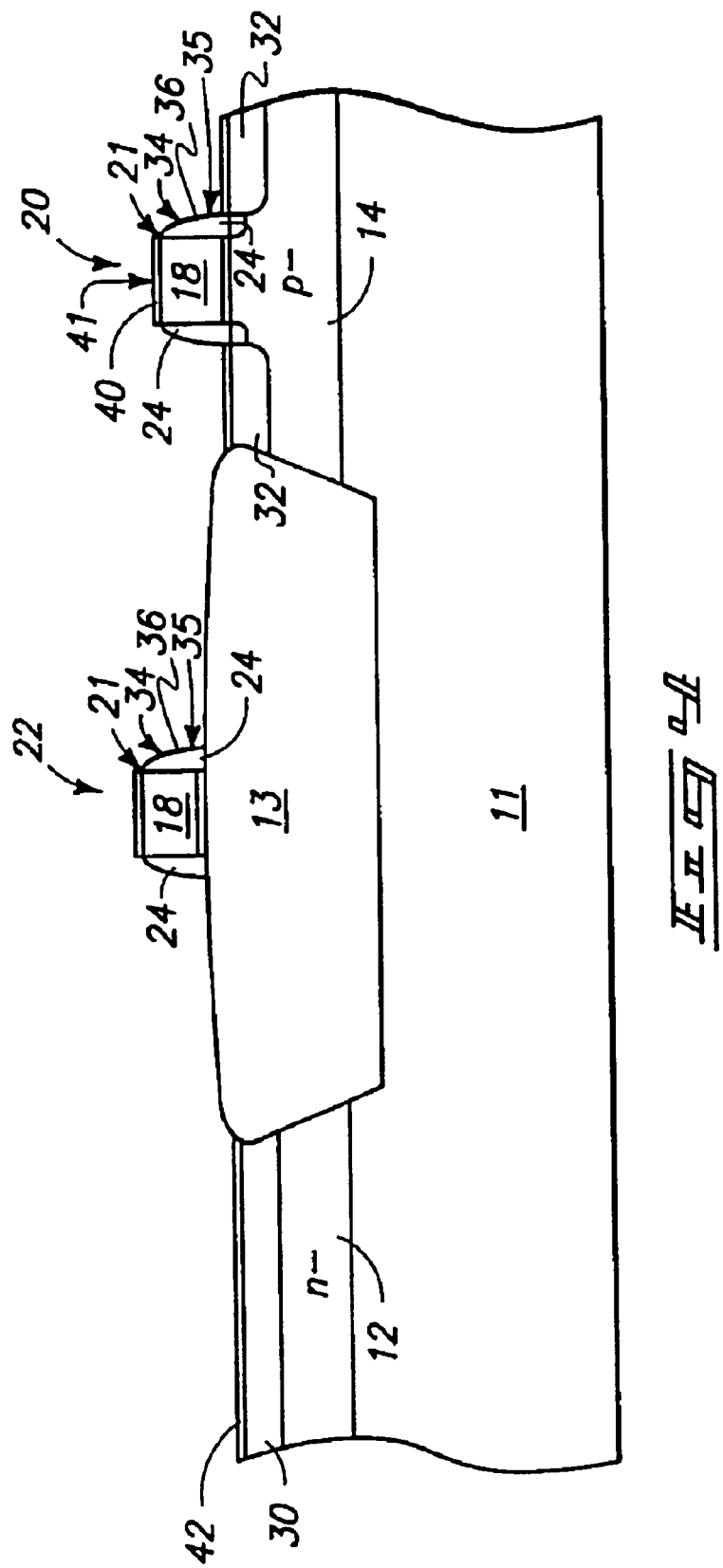
FIG. 4 is a view of the FIG. 2 wafer fragment at a processing step subsequent to that shown by FIG. 3.

Referring to FIG. 4 and after forming sidewall spacers 24, in at least one common step, a conductive suicide 40 is formed on first transistor gate 20 semiconductive material 18 and a conductive silicide 42 on second transistor source/drain region 30. Silicide is also shown formed on source/drains 32. A preferred method of forming the subject suicide is by conventional refractory metal layer deposition, exposure to annealing conditions, and selective etch of the non-transformed refractory metal from all of the substrate. By way of example only, an exemplary preferred metal is tungsten in the formation of tungsten silicide. Of course, other existing or yet-to-be-developed techniques are also contemplated. In the above-described manner, silicide would typically be formed over all exposed silicon surfaces, with silicide regions 40 and 42 being of particular interest in the particularly described preferred embodiment. Conductive silicide 40 on first transistor gate 20 has an uppermost surface 41 which is elevationally higher than uppermost surface 21 of respective adjacent sidewall spacers 24. In the context of this document, "elevationally higher" means greater than or equal to 75 Angstroms.

The above-described preferred processing is but one exemplary embodiment of providing a substrate having a gate of a first transistor (i.e., gate 20) and a source/drain region (i.e., region 30) of a second transistor (i.e., T4p). Any other existing or yet-to-be-developed methods of providing such is contemplated, in accordance with the literal wording of certain of the claims included herein.

Figure 5:
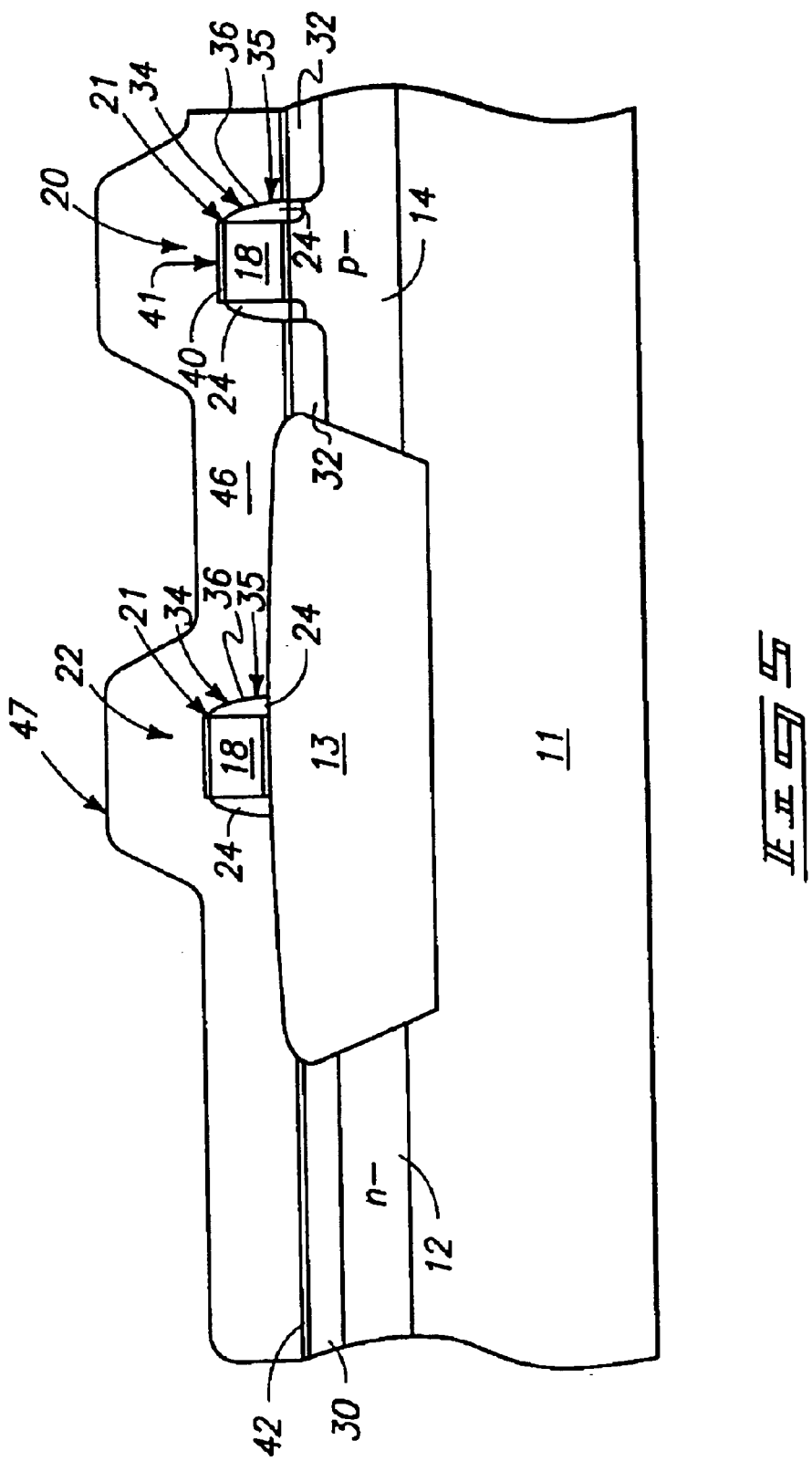
FIG. 5 is a view of the FIG. 2 wafer fragment at a processing step subsequent to that shown by FIG. 4.

Referring to FIG. 5, a first dielectric layer 46 is formed over first transistor gate 20 and second transistor source/drain region 30. Further in accordance with one implementation, such layer is formed over and preferably on (in contact with) first transistor gate silicide 40 and second transistor source/drain region silicide 42. Exemplary preferred materials for layer 46 include undoped silicon dioxide and silicon nitride (and mixtures thereof). In the context of this document, "undoped silicon dioxide" means silicon dioxide having less than 0.1% concentration by weight of the total of one or both of boron and phosphorous in the silicon dioxide. An exemplary preferred thickness for layer 46 is from 500 Angstroms to 2,000 Angstroms. In the illustrated and preferred or typical embodiment, first dielectric layer 46 has a non-planar outermost surface 47.

Figure 6:
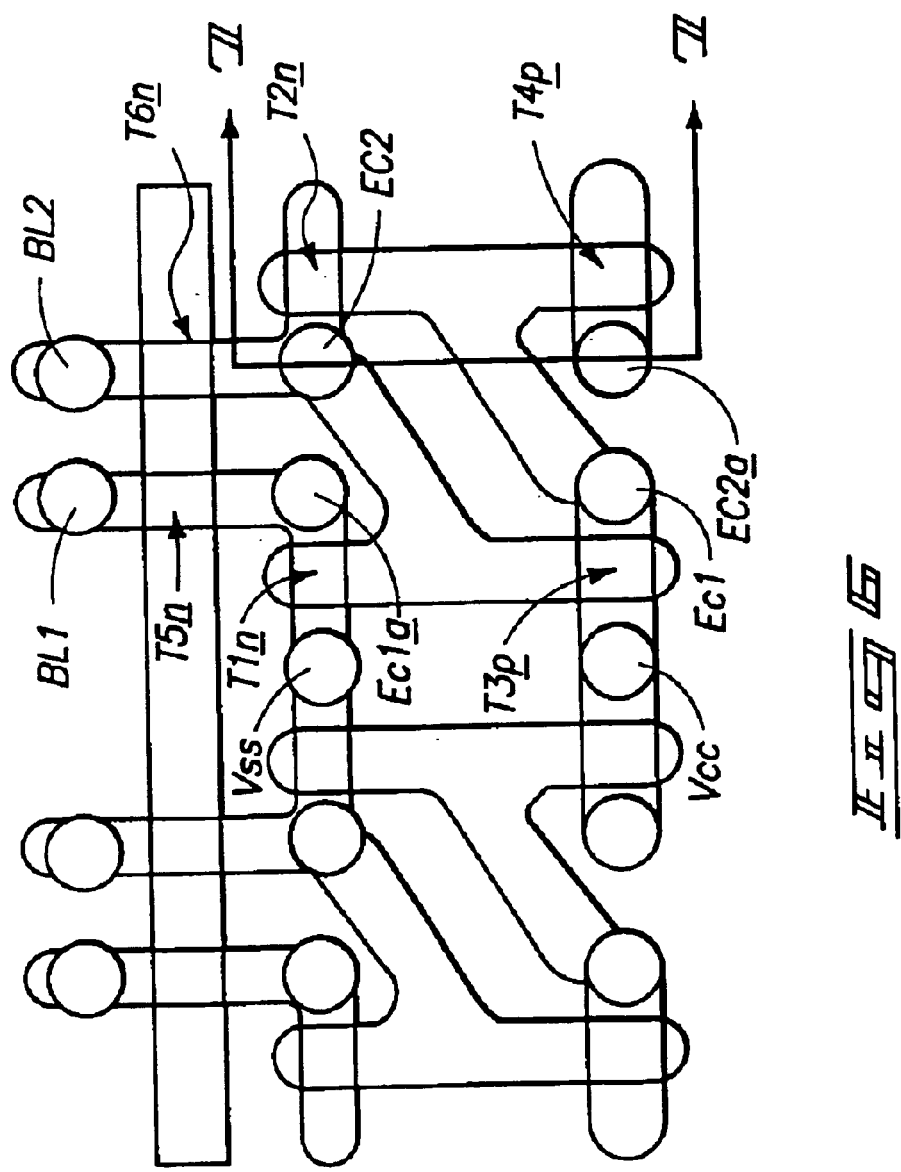
FIG. 6 a diagrammatic top plan view of one implementation of circuitry layout of the FIG. 1 schematic on the semiconductor wafer fragment.
Figure 7:
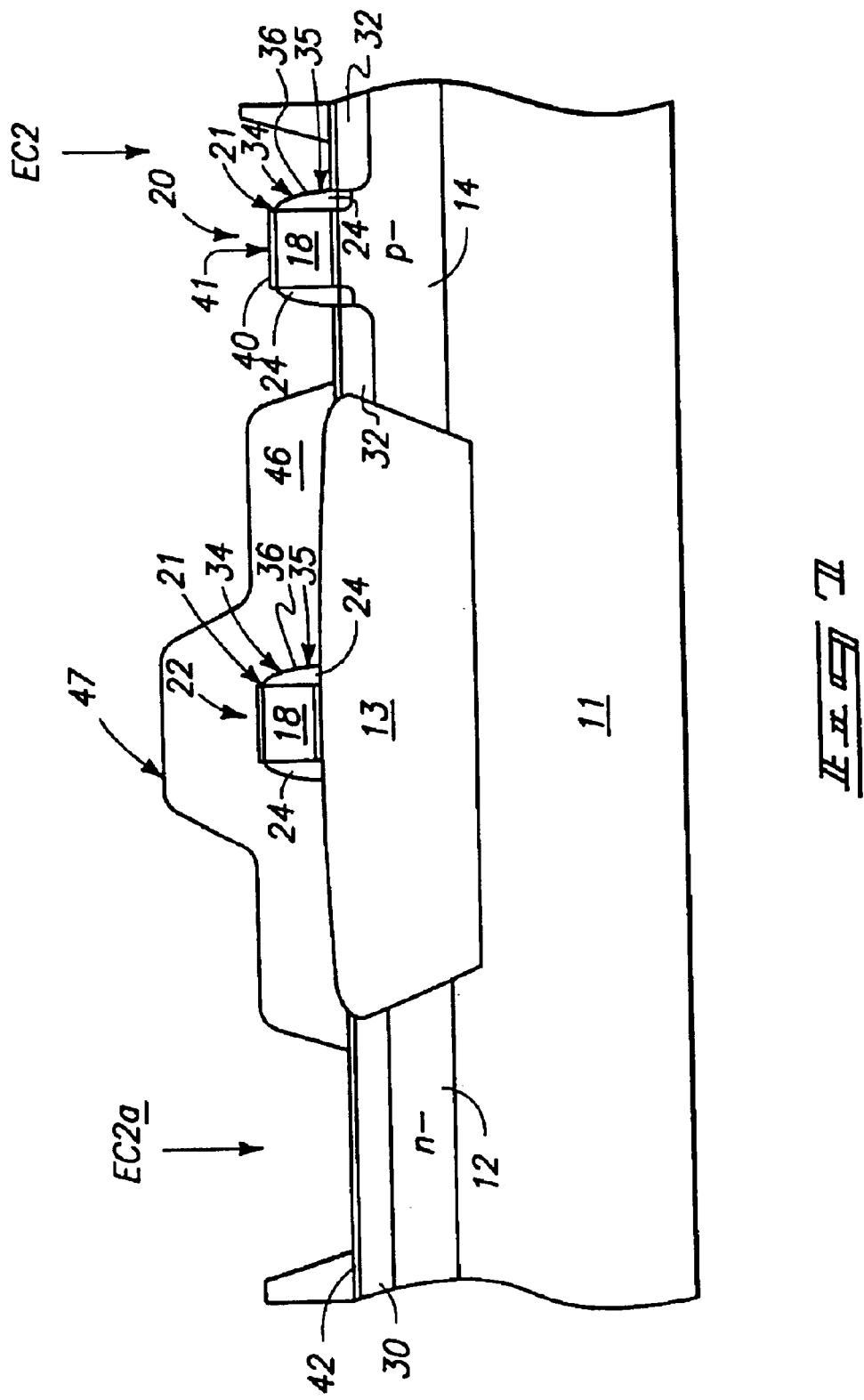
FIG. 7 is a sectional view taken through line 7—7 in FIG. 6, and corresponds to a processing sequence of the FIG. 2 wafer taken subsequently to FIG. 5.

Referring to FIGS. 1, 6 and 7, contact openings are formed in the first dielectric layer to the first transistor gate and to the second transistor source/drain region. FIG. 7 depicts a contact opening EC2 formed in first dielectric layer 46 to first transistor gate 20 conductive silicide 40, and a contact opening EC2a to second transistor source/drain region 30 silicide 42. Preferably, such formation occurs by suitable lithography or other method and etching. Reference to FIGS. 1, 6 and 7 shows the preferred layout of the respective components in formation with respect to schematic, top plan and fragmentary diagrams.

Figure 8:
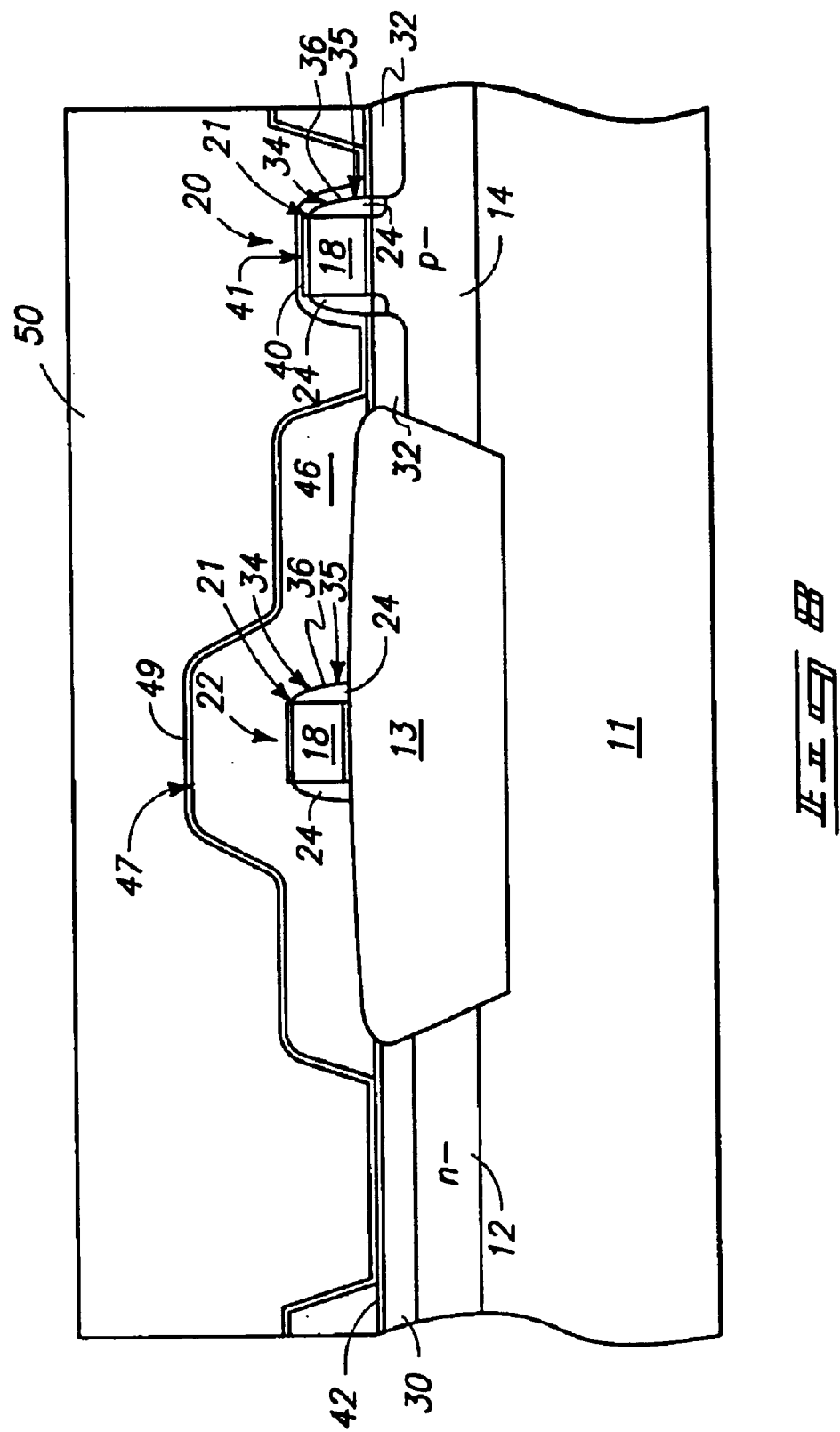
FIG. 8 is a view of the FIG. 7 wafer fragment at a processing step subsequent to that shown by FIG. 7.

Referring to FIG. 8, a second dielectric layer 50 is formed over first dielectric layer 46 and to within contact openings EC2 and EC2a. A preferred material for second dielectric layer 50 is a composite of an initial thin layer 49 (i.e., 150 Angstroms to 300 Angstroms) of $Si_xO_yN_z$ with the remainder being silicon dioxide doped with at least one of phosphorous and boron to a concentration of at least 3.0% weight percent. In one preferred embodiment, and as illustrated, second dielectric layer 49/50 is formed in contact with silicides 40 and 42, and is formed to be planar, for example by reflow or subsequent planarization after formation, for instance by polishing.

Figure 9:
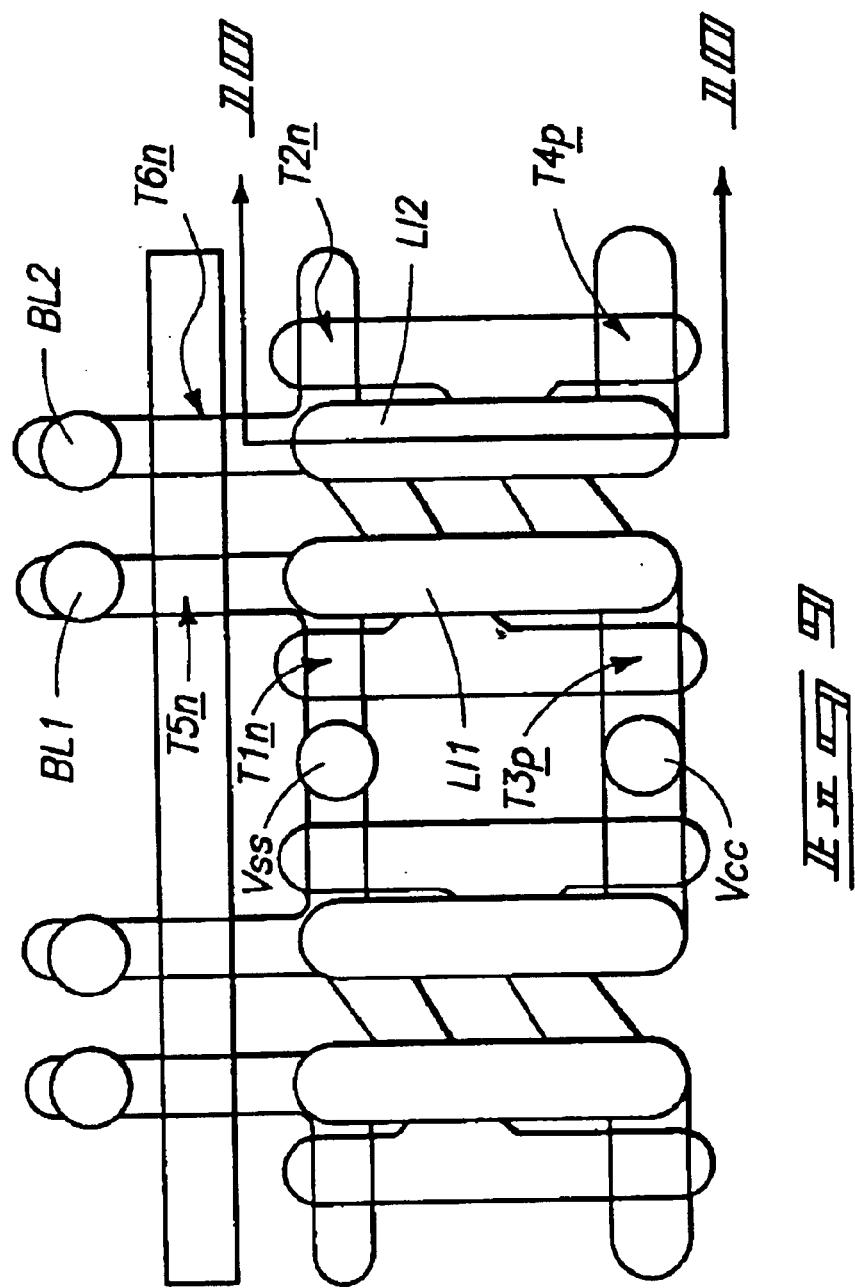
FIG. 9 is a diagrammatic top plan view of the FIG. 7 wafer fragment corresponding in processing sequence subsequent to that depicted by FIG. 8.
Figure 10:
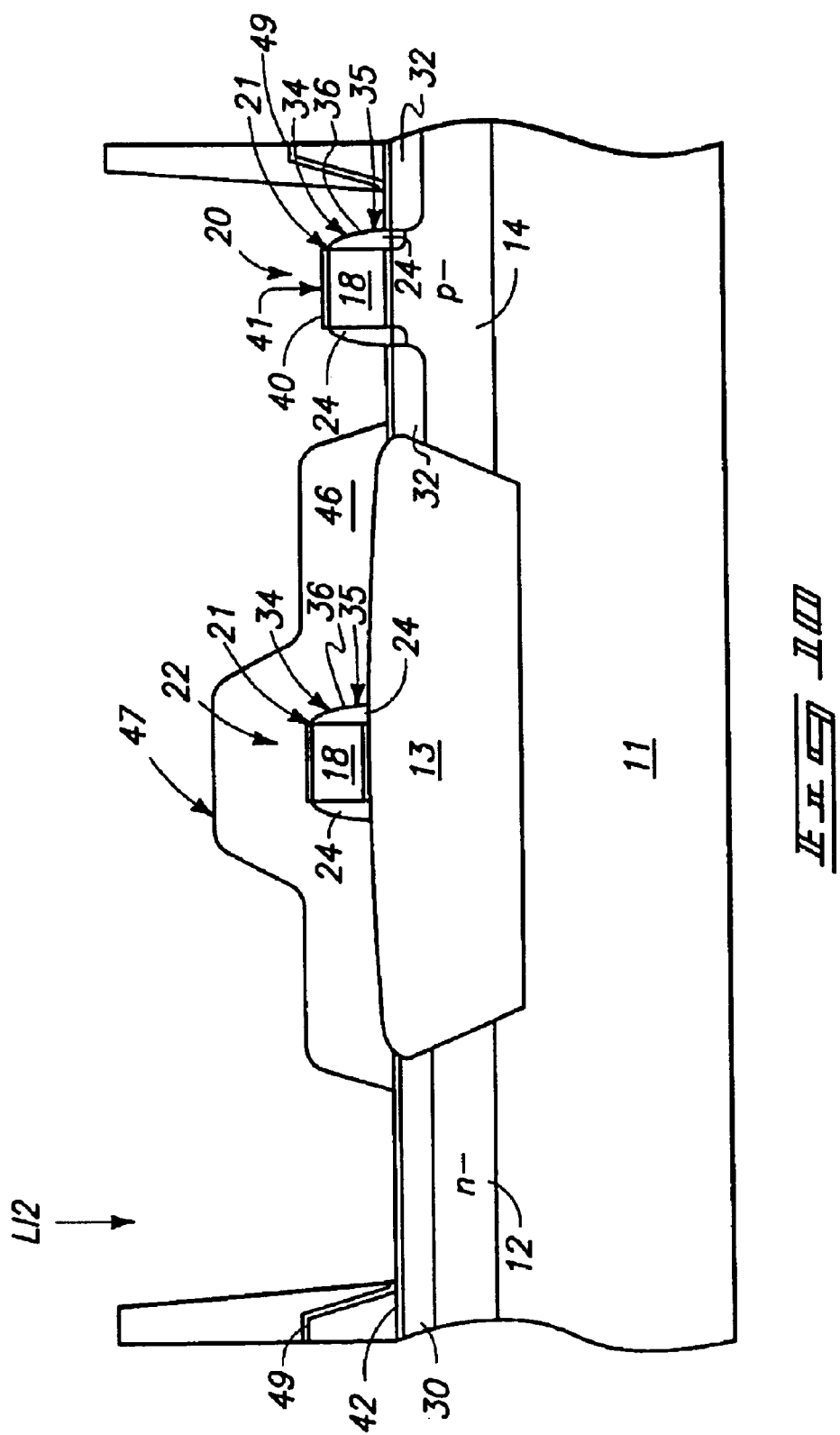
FIG. 10 is a sectional view through line 10—10 in FIG. 9.

Referring to FIGS. 9 and 10, second dielectric layer 49/50 is etched preferably selectively relative to first dielectric layer 46 to form at least a portion of a local interconnect outline LI2 within second dielectric layer 49/50 to extend between first transistor gate silicide 40 and second transistor source/drain region silicide 42. The etch is preferably selective to insulative material of sidewall spacers 24 and to silicide, and preferably also removes at least some of second dielectric layer material 49/50 within contact openings EC2 and EC2a. In the context of this document, "selective" or "selectively" means an etch ratio of one material to another of at least 2:1. Such interconnect outline might be prepared by lithography or other methods. An exemplary and preferred technique for etching dielectric layers 49/50 to form LI1, where layer 50 comprises BPSG and where 49 comprises $Si_xO_yN_z$ uses $CHF_3$, $CH_2H_2$, $CF_4$ and Ar, which is highly selective to the $Si_xO_yN_z$. The $Si_xO_yN_z$ can then be etched subsequently using any suitable chemistry.

Figure 11:
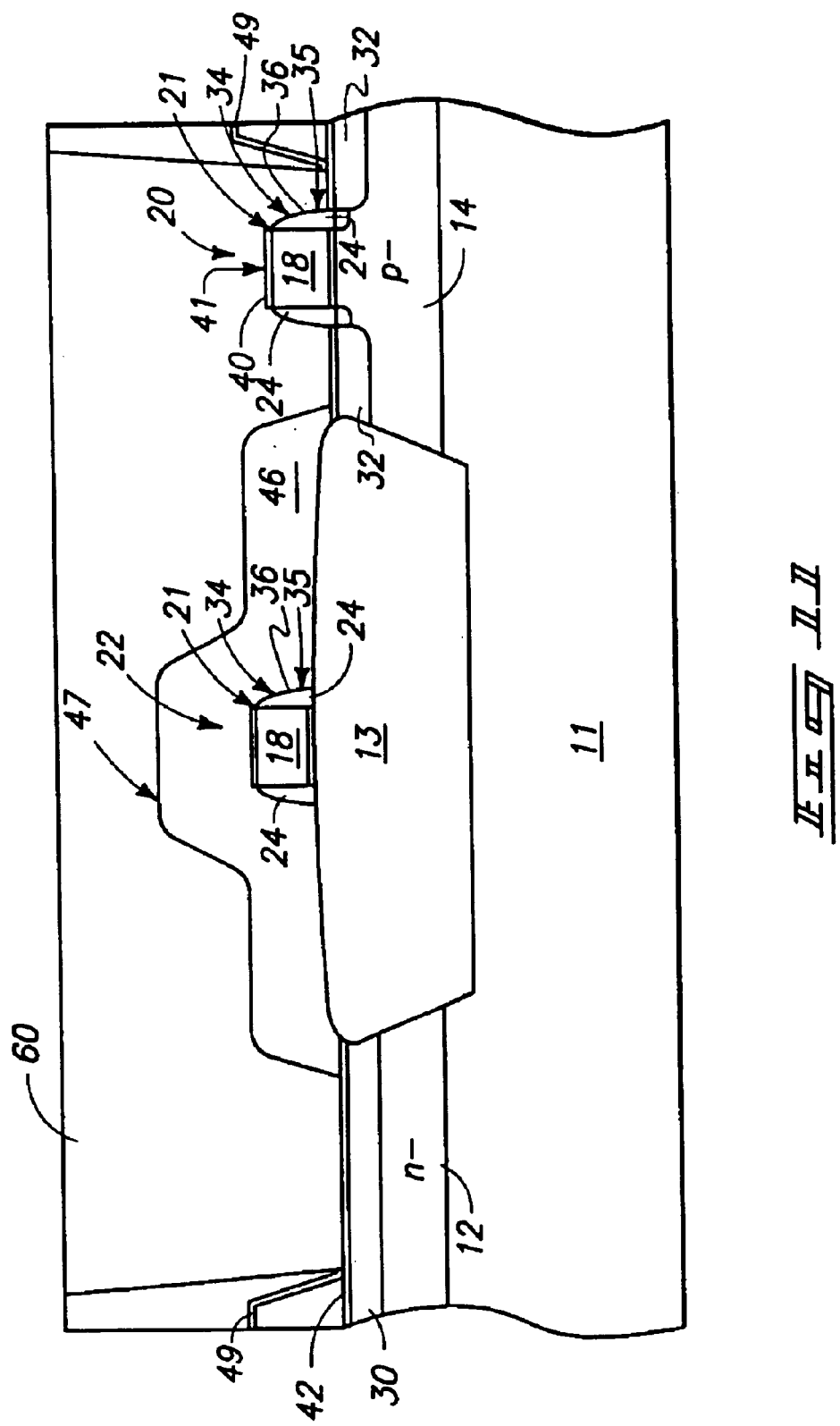
FIG. 11 is a view of the FIG. 7 wafer fragment at a processing step subsequent to that shown by FIG. 10.

Referring to FIG. 11, conductive material 60 is formed within local interconnect outline LI2 within second dielectric layer 49/50, which electrically connects first transistor gate 20 silicide 40 with second transistor T4p source/drain region 30. Preferably, the material is formed on (in contact with) such silicide, and can include one or more conductive materials. One exemplary preferred technique is to chemical vapor deposit titanium nitride, physical or chemical vapor deposit tungsten thereover, and polish such back relative to the outer surface of insulative layer 50 to form the illustrated local interconnect within an opening/outline formed within layer 49/50.

The invention also contemplates integrated circuitry comprising a substrate having first and second transistor gates (for example, the gates for transistor T1n and for T4p). A source/drain region is received proximate the second transistor gate, and at least the first transistor gate comprises conductively doped semiconductive material and a conductive silicide received elevationally outward thereof and in electrical connection therewith. The semiconductive material and the suicide have respective elevationally outermost surfaces. The first transistor gate comprises opposing sidewalls of the semiconductive material and the silicide. A pair of insulative sidewall spacers, for example spacers 24, are received over the first transistor gate sidewalls. The spacers have respective uppermost surfaces which are substantially elevationally coincident with the uppermost surface of the semiconductive material of the gates. A conductive local interconnect electrically connects the first transistor gate silicide with the source/drain region proximate the second transistor gate.

The most preferred embodiment of the invention incorporates the above gate etch with undoped polysilicon and without having to etch silicide, followed by salicidation and subsequent self-aligned contact etch.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising:
   a substrate comprising first and second transistor gates, a source/drain region proximate the second transistor gate, the first transistor gate comprising conductively doped semiconductive material and a conductive suicide received elevationally outward thereof and in electrical connection therewith, the semiconductive material and the suicide having respective elevationally outermost surfaces, the first transistor gate comprising opposing sidewalls of the semiconductive material and the silicide;
   a first dielectric layer received over the first transistor gate, the first dielectric layer being selected from the group consisting of undoped silicon dioxide, silicon nitride and mixtures thereof;
   a pair of insulative sidewall spacers received over the first transistor gate sidewalls, the sidewall spacers having respective uppermost surfaces which are substantially elevationally coincident with the uppermost surface of the semiconductive material;
   a conductive local interconnect electrically connecting the first transistor gate suicide with the source/drain region proximate the second transistor gate, the conductive local interconnect having sidewalls and being received over the first dielectric layer; and
   a second dielectric layer different in composition from the first a second dielectric layer the second dielectric layer comprising a doped silicon dioxide layer received over a $Si_xO_yN_z$ layer and which contact the conductive local interconnect sidewalls.

2. The integrated circuitry of claim 1 wherein the insulative sidewall spacers comprise a top region and a base region, the base region being laterally wider than the top region.

3. The integrated circuitry of claim 1 wherein the insulative sidewall spacers comprise a top region and a base region, the sidewall spacers having a laterally outermost surface which curves laterally inward from the base region to the uppermost surface of the top region.

4. The integrated circuitry of claim 1 wherein the substrate comprises bulk monocrystalline silicon, and the source/drain region comprises a diffusion region formed within the bulk monocrystalline silicon.

5. The integrated circuitry of claim 1 wherein the semiconductive material comprises conductively doped polysilicon.

6. The integrated circuitry of claim 1 wherein the first and second transistors are of different conductivity type.

7. The integrated circuitry of claim 1 wherein the first and second transistors comprise a portion of a SRAM cell.

8. The integrated circuitry of claim 1 wherein the first dielectric layer comprises undoped silicon dioxide.

9. The integrated circuitry of claim 1 wherein the first dielectric layer comprises silicon nitride.

10. The integrated circuitry of claim 1 wherein the first dielectric layer comprises a mixture of undoped silicon dioxide and silicon nitride.

11. The integrated circuitry of claim 1 wherein the first dielectric layer has a thickness of from 500 Angstroms to 2000 Angstroms.

12. The integrated circuitry of claim 1 wherein the first dielectric layer has a nonplanar outermost surface.

13. The integrated circuitry of claim 1 wherein the second dielectric layer has a planar outermost surface.

* * * * *

UNITED STATES PATENT AND TRADEMARK OFFICE
CERTIFICATE OF CORRECTION

PATENT NO. : 6,911,702 B2  
APPLICATION NO. : 10/305604  
DATED : June 28, 2005  
INVENTOR(S) : Abbott Page 1 of 1

It is certified that error appears in the above-identified patent and that said Letters Patent is hereby corrected as shown below:

Column 1,  
Line 7, delete "Oct. 24, 2001" after "filed on" and insert -- Oct. 24, 2001, now --.  
Line 66, delete "suicide" before "and" and insert -- silicide --.

Column 2,  
Line 41, insert -- is -- after "Fig. 6".

Column 3,  
Line 47, delete "gate," after "respective" and insert -- gate --.

Column 4,  
Line 21, delete "suicide" after "conductive" and insert -- silicide --.

Column 6,  
Line 37, delete "suicide" after "gate" and insert -- silicide --.  
Line 42, delete "a second dielectric layer" after "first" and insert -- dielectric layer, --.

Signed and Sealed this

Eleventh Day of July, 2006

JON W. DUDAS  
*Director of the United States Patent and Trademark Office*